United States Patent
Schnell et al.

(10) Patent No.: US 7,694,196 B2
(45) Date of Patent: Apr. 6, 2010

(54) SELF-DIAGNOSTIC SCHEME FOR DETECTING ERRORS

(75) Inventors: Josef Schnell, Charlotte, VT (US); Klaus Hummler, Apex, NC (US); Jong Hoon Oh, Chapel Hill, NC (US); Wayne Frederick Ellis, Jericho, VT (US); Jung Pill Kim, Cary, NC (US); Oliver Kiehl, Charlotte, VT (US); Octavian Beldiman, South Burlington, VT (US); Lee Ward Collins, Cary, NC (US)

(73) Assignee: Qimonda North America Corp., Cary, NC (US)

( * ) Notice: Subject to any disclaimer, the term of this patent is extended or adjusted under 35 U.S.C. 154(b) by 210 days.

(21) Appl. No.: 11/943,428

(22) Filed: Nov. 20, 2007

(65) Prior Publication Data

US 2009/0129186 A1 May 21, 2009

(51) Int. Cl.
*G11C 29/00* (2006.01)
(52) U.S. Cl. .......................... 714/723; 714/42
(58) Field of Classification Search ................. 711/170; 702/117; 714/742, 723, 737, 732, 42
See application file for complete search history.

(56) References Cited

U.S. PATENT DOCUMENTS

| | | | | |
|---|---|---|---|---|
| 5,727,000 A | * | 3/1998 | Pizzica | 714/737 |
| 6,564,346 B1 | * | 5/2003 | Vollrath et al. | 714/723 |
| 6,671,644 B2 | * | 12/2003 | Huisman et al. | 702/117 |
| 2008/0115029 A1 | * | 5/2008 | Kusko et al. | 714/742 |
| 2009/0049267 A1 | * | 2/2009 | Perner et al. | 711/170 |

* cited by examiner

*Primary Examiner*—David Ton
(74) *Attorney, Agent, or Firm*—Patterson & Sheridan, L.L.P.

(57) ABSTRACT

The present invention is generally related to integrated circuit devices, and more particularly, to methods and systems of a multi-chip package (MCP) containing a self-diagnostic scheme for detecting errors in the MCP. The MCP generally comprises a controller, at least one volatile memory chip having error detection logic, at least one non-volatile memory chip, and at least one fail signature register for storing fail signature data related to memory errors detected in the MCP. The controller can poll the fail signature register for fail signature data related to memory errors stored therein. Upon detection of fail signature data, the controller can store the fail signature data on a fail signature register located on a non-volatile memory.

20 Claims, 3 Drawing Sheets

SELF-DIAGNOSTIC SCHEME FOR DETECTING ERRORS

BACKGROUND OF THE INVENTION

Multi-chip packages (MCPs) are individual semiconductor packages, made of plastic or ceramic, containing two or more chips connected internally with wire-bonding. MCPs allow multiple chips to be integrated into a single, more compact, package with the same footprint on a printed circuit board (PCB) as a single chip. MCPs typically contact the PCB with pins, such as solder balls or other type of conductive elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
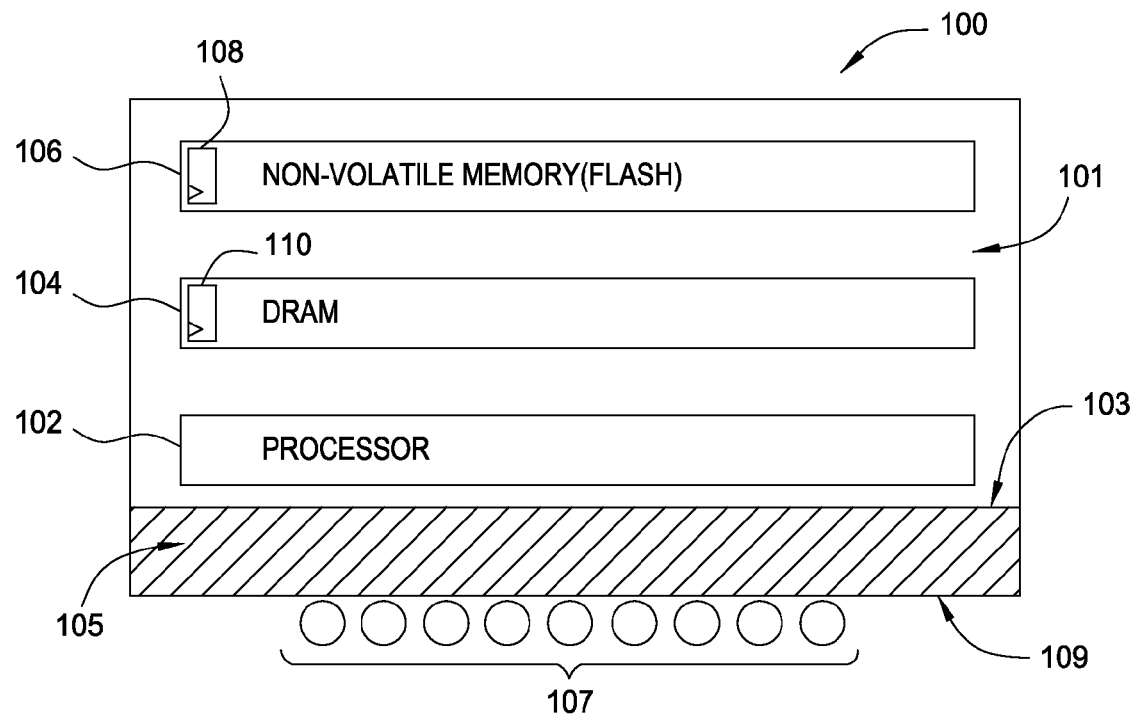
FIG. 1A illustrates a multi-chip package (MCP) according to an embodiment of the present invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with, or include, any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses) and any other types of nonvolatile memory.

Embodiments of the invention may generally provide techniques that allow self-diagnosis of errors found in a multi-chip package (MCP). For example, for some embodiments, when an error is detected, information regarding the error can be stored in a non-volatile memory, which can be later read to determine characteristics regarding the error.

One embodiment of the invention provides an MCP, generally comprising a first chip, comprising error detection logic and a first fail signature storage element, wherein the first chip is a volatile memory chip, a second chip, comprising a second fail signature storage element, wherein the second chip is a non-volatile memory chip and a controller chip. The controller chip is configured to copy the fail signature data from the first chip to the second chip, wherein the first and second fail signature storage elements are configured for storing fail signature data related to memory errors detected in the MCP. Furthermore, the chips are encapsulated in packaging thereby forming the multi-chip package.

Another embodiment provides a method for processing memory-related errors on an MCP. The method generally comprises executing a write or read command from a controller located in the MCP to access data in a volatile memory chip, detecting an error associated with execution of the write or read command, storing fail signature data associated with the error in a fail signature storage element located in the volatile memory chip, obtaining, by the controller, the fail signature data from the fail signature storage element and storing the fail signature data in a non-volatile memory chip of the MCP.

Yet another embodiment provides a system, generally comprising a printed circuit board (PCB), a first chip, comprising error detection logic and a first fail signature storage element, wherein the first chip is a volatile memory chip, a second chip, comprising a second fail signature storage element, wherein the second chip is a non-volatile memory chip and a controller chip. The controller chip is configured to copy the fail signature data from the first chip to the second chip, wherein the first and second fail signature storage elements are configured for storing fail signature data related to memory errors detected in the MCP. Furthermore, the chips are encapsulated in packaging thereby forming the multi-chip package, thus allowing the multi-chip package to be disposed on the PCB.

Persons skilled in the art, having the benefit of the present disclosure, will recognize other embodiments within the scope of the present invention.

FIG. 1A is a block diagram of an embodiment of a multi-chip package (MCP) 100. The MCP 100 may include a plurality of chips housed within an encapsulation material 101, for example ceramic or plastic. Each of the plurality of chips may have contact pads (not illustrated) on a surface facing away or facing towards a package substrate 105. The contact pads of the chips may be electrically connected (e.g., via bond wires, typically made of gold or aluminum) to an upper surface 103 of a package substrate 105. Solder balls 107 or some other type of external lead may be connected to a lower surface 109 of the package substrate to provide an external connection, for example, to a printed-circuit board (PCB) (not illustrated). Additionally, an insulating spacer (not illustrated) may be provided between the plurality of chips to avoid electrical shorts.

In general, the MCP 100 may include at least two chips. In the representative illustration, the MCP 100 includes three chips; specifically, a controller 102, for example a processor, a volatile memory chip 104 (illustratively shown as a DRAM), and a non-volatile memory chip 106 (illustratively shown as a FLASH memory chip). In one embodiment, the MCP 100 may include a plurality of volatile and non-volatile memories. Each memory chip (volatile or non-volatile) may also contain a fail signature storage element (FSSE), which may be used to store information regarding memory-related errors detected in the MCP 100. Accordingly, FIG. 1A shows the DRAM 104 having a first FSSE 110 (DRAM_FSSE) and the FLASH memory 106 having a second FSSE 108 (FLASH_FSSE). In one embodiment, the respective fail signature storage elements may be one or more registers. In another embodiment, a fail signature storage element may also be located on the processor 102.

Figure 1B:
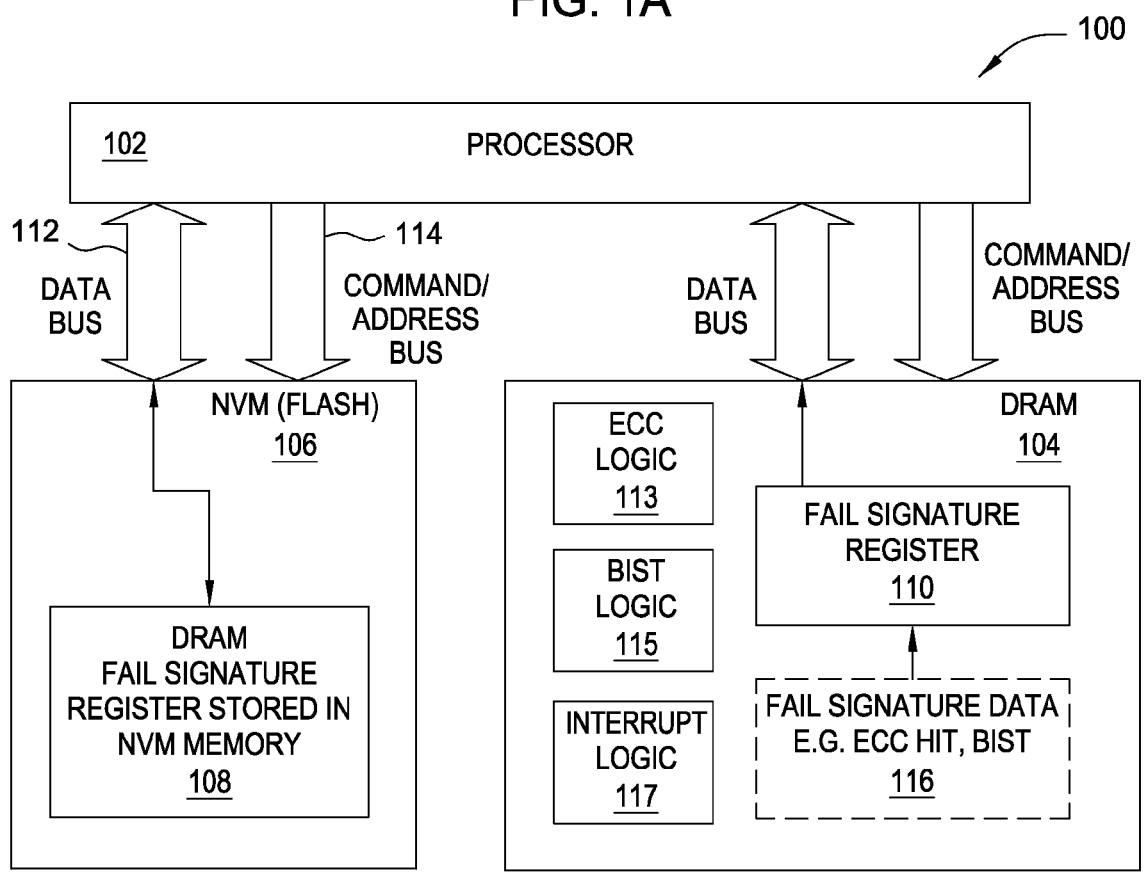
FIG. 1B is a logical block diagram of a multi-chip package (MCP) according to an embodiment of the present invention.

The components of the MCP 100 are connected in a manner such that the processor 102 can transfer data, via a data bus 112, to and from each memory chip 104, 106, as illustrated in FIG. 1B. The processor 100 can initiate various types of data transfers by issuing different commands to the memories via a Command/Address bus 114. Examples of such commands include a Memory Read or Memory Write command. In one embodiment, the Command/Address bus 114 may be sufficiently wide to simultaneously supply (i.e., in parallel) the command and address to its respective memory. In another embodiment, the command and address may be multiplexed across a narrower bus.

Additionally, the processor 102 is capable of issuing appropriate commands to access each FSSE 108, 110. In one embodiment, the processor 102 issues configuration commands, such as a Status Register Read to access a memory's configuration space, which may contain a plurality of configuration storage elements (e.g., registers) including the FSSE 108, 110. Alternatively, in another embodiment, the configuration registers may be memory-mapped. In this case, the configuration registers (including the FSSE 108, 110) reside in a portion of the memory space of the memories that is accessible via normal read and write commands.

The MCP 100 may also contain logic to detect different types of memory-related errors. For example, in one embodiment, the processor 102 and/or DRAM 104 may be equipped with Error Correction Code (ECC) logic. Illustratively, FIG. 1A shows ECC logic 113 residing on the DRAM 104. In one embodiment, during a Memory Read, the ECC logic 113 located on the DRAM 104 may be configured to detect and/or correct an error while reading data from its memory array before sending the data to the processor. Correcting the data beforehand may result in the error being transparent to the processor. Therefore, the fail signature storage element 110 may store information regarding the error upon detection and/or correction of the data, thus allowing a processor to inquire about any errors detected in the DRAM (further described below in FIGS. 2 and 3).

In one embodiment, the processor 102 and/or DRAM 104 may also contain ECC logic to detect errors on data transmitted along the data bus 112. In this case, the ECC logic located in the processor 102 may check for errors on data received from the DRAM 104 during a read operation. Subsequent to detecting an error, the processor 102 may store information regarding the error in its fail signature storage element.

Conversely, during a write operation, the ECC logic located in the DRAM 104 may check for errors on data received from the processor 102. Subsequent to detecting an error, the DRAM 104 may store information regarding the error in its fail signature storage element 110.

Another type of detectable error that may be supported in the MCP 100 is a failed memory cell. These types of errors can be detected by using a Built-In Self Test (BIST) Engine 115 which may be located on a DRAM 104 as shown in FIG. 1A. The BIST Engine can perform a series of writes, followed by reads, to all or a portion of memory addresses. A discrepancy between the data written and the data read to a particular address indicates a failed memory cell.

Figure 2:
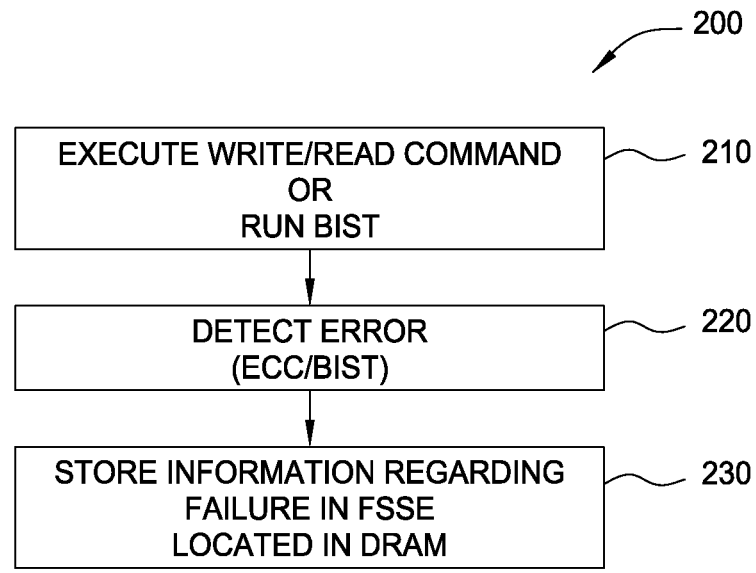
FIG. 2 is a flowchart of example operations for storing error-related information in a fail signature storage element of a volatile memory according to an embodiment of the present invention.
Figure 3:
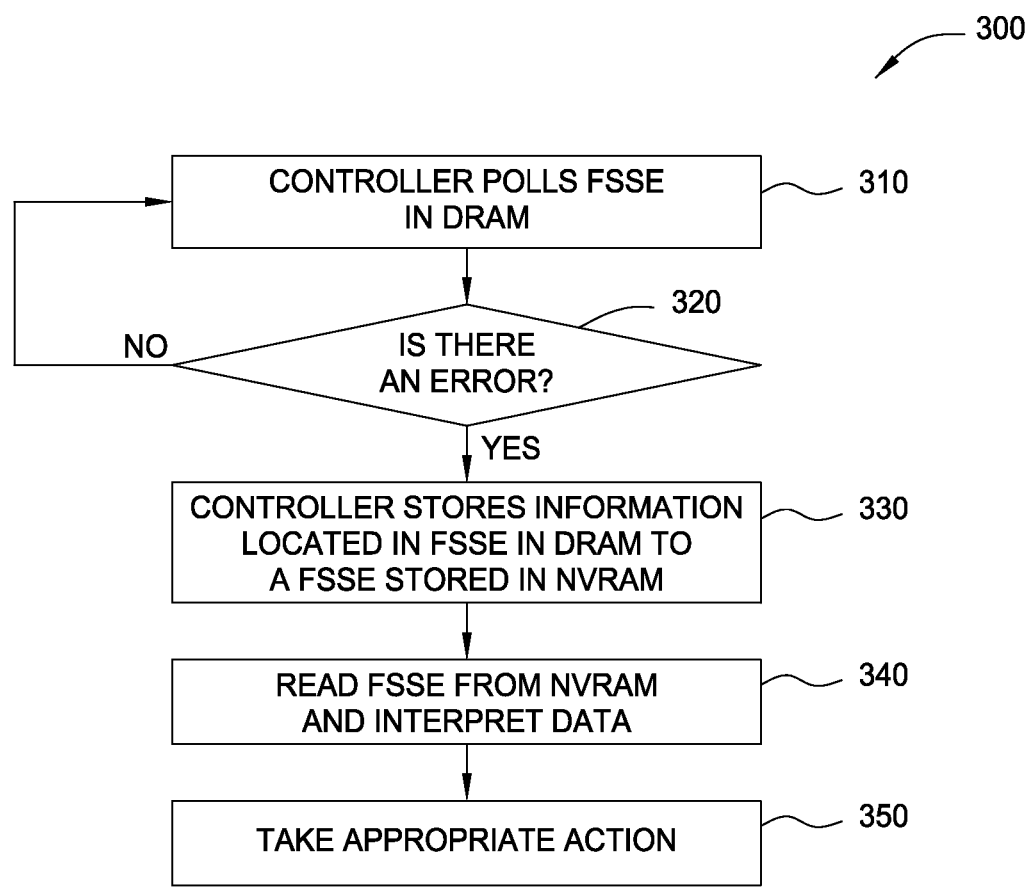
FIG. 3 is a flowchart of example operations for storing error-related information in a fail signature storage element of a non-volatile memory according to an embodiment of the present invention.

As stated earlier, the DRAM_FSSE 110 can be used to store information (further described below in FIG. 4) regarding memory-related errors detected in the MCP 100. This can allow the MCP 100 to self-diagnosis errors found in the MCP 100. FIGS. 2 and 3 illustrate example operations 200, 300 (respectively) for self diagnosing errors in an MCP 100. Referring first to FIG. 2, an operation 200 is shown for storing error date in the FSSE 110. The operation 200 begins at step 210, where a write or read command may be initiated (e.g., by either the processor or the BIST engine). Subsequently, at step 220, if an error is detected (e.g., by the ECC logic or the BIST engine), pertinent information regarding the error (Fail Signature Data 116) can be stored into the DRAM_FSSE 110 located in DRAM at step 230. Examples of such pertinent information are described below with respect to FIG. 4. In an embodiment where the processor has an FSSE, information regarding an error (such as an ECC error detected during a Memory Read) and other related information further described below in FIG. 4, may also be stored in the processor's FSSE.

The Fail Signature Data 116 stored in the DRAM_FSSE 110 may be polled to perform self-diagnostics of errors found in the MCP. One embodiment for performing such an operation 300 is shown in FIG. 3. At step 310, the processor 102 can poll the DRAM_FSSE 110. Once the FSSE 110 is read, at step 320, a determination may be made if an error has been stored. If no error has been stored, the processor 102 can continue to poll the DRAM_FSSE 110 periodically. In one embodiment, the processor 102 may periodically poll the DRAM_FSSE 110 at a predefined frequency. It is contemplated that the predefined frequency may be permanently set (e.g., by blowing appropriate fuses) or may be configurable (i.e., dynamically settable to any of a plurality of values). In the latter case, the frequency may be selected by programming a value, representative of a frequency, in a frequency selection storage element. Accordingly, the frequency at which the DRAM_FSSE 110 is polled can be determined by the value programmed in the frequency selection storage element. In one embodiment, the frequency selection storage element may be located in the processor 102. In another embodiment, the frequency selection storage element may be located in the DRAM 104.

In another embodiment, the DRAM 104 may assert an interrupt, provided by interrupt logic 117 located in the DRAM 104, to notify the processor 102 that an error has been stored. In such an embodiment, the processor does not need to poll the DRAM_FSSE 110. Instead, the processor may wait until the interrupt is received from the DRAM 104 before reading the DRAM_FSSE 110.

Once an error has been stored, the processor 102, at step 330, may copy the information located in the DRAM_FSSE 110 to the FSSE stored in a FLASH memory 108 (FLASH_FSSE 108). The processor 102 may copy the information by first reading the information in the DRAM_FSSE 110. Once the information is read, the processor 102 may write the information to the FLASH_FSEE 108. In one embodiment, once the information is copied to the FLASH_FSSE 108, the information stored in the DRAM_FSSE 110 may be cleared. In another embodiment, the information stored in the DRAM_FSSE 110 may be left unchanged. Furthermore, in another embodiment, the DRAM_FSSE 110 and/or the FLASH_FSEE 108 may be configured to store only the first error found in the system during a power on cycle. Alternatively, the DRAM_FSSE 110 and/or the FLASH_FSSE 108 may be configured to store the latest error found in the system during a power-on cycle.

Once the error information is stored in the FLASH_FSSE 108, at step 340, a user can read and interpret the error information from the FLASH memory 106, thus allowing a user to take appropriate action at step 350. For example, the error information can be used to gather statistical information such as the percentage of failure rate, which can facilitate understanding of the retention behavior of memory cells and single cell failures in the system.

Figure 4:
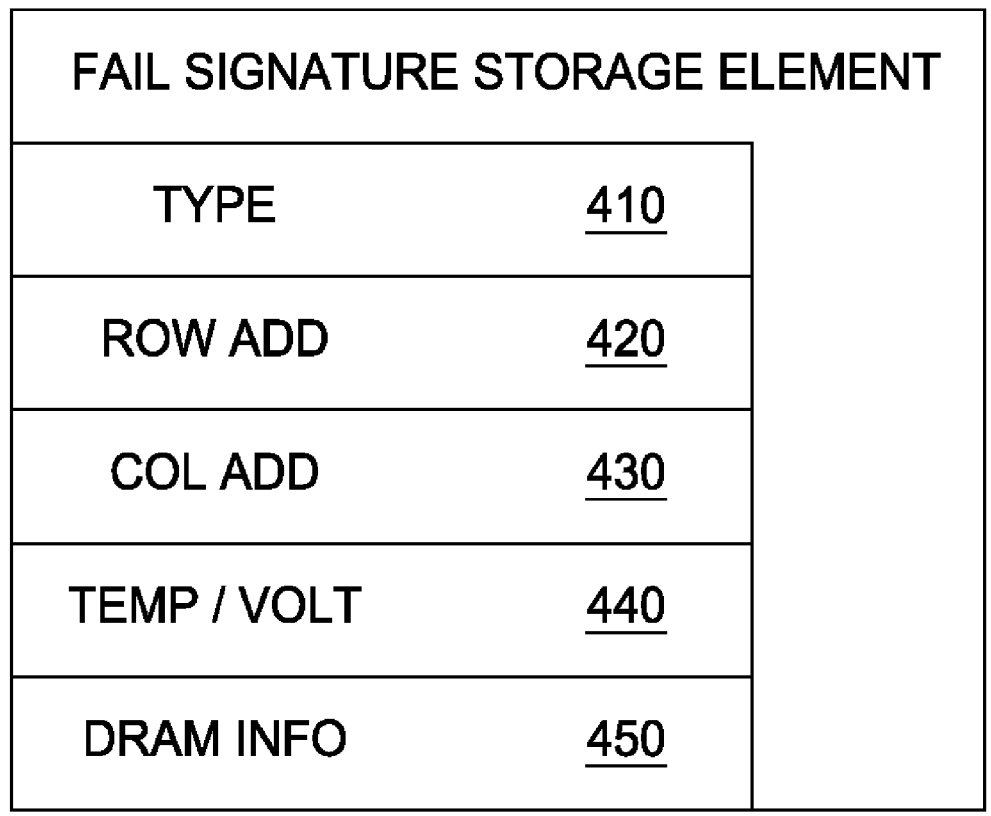
FIG. 4 is illustrates a fail signature storage element according to an embodiment of the present invention.

FIG. 4 shows a fail signature storage element 400, according to one embodiment. The FSSE 400 may be representative of either or both of the DRAM_FSSE 110 and the FLASH_FSSE 108 described above. In general, the FSR 400 can store command-specific information regarding errors detected in the MCP.

For example, the FSSE 400 includes a type field 410 for identifying the type of command that encountered an error. Illustrative types of commands include 410, for example, reads, writes, etc. Furthermore, the FSSE 400 may also contain the row address (in a row address field 420) and column address (in a column address field 430) of that command.

Additionally, the FSSE 400 may also contain system-specific information, such as operating parameters of the MCP indicating the temperature and/or voltage (in a temp/volt field 440) of the system of when the error occurred. Furthermore, the FSSE may also store other system-specific information such as the manufacturer ID (in a ID field 450) of the DRAM and/or the FLASH memory. Moreover, the FSSE may also store information regarding the wafer from where the DRAM originated from, such as the manufacturing lot number, wafer number, and x-y coordinates of the DRAM with respect to the wafer. Persons skilled in the art will recognize other organizations and content for the FSSE.

While the information stored in the fail signature storage element can be useful for determining the characteristics of errors found in a system, the information can also be useful for reproducing errors found in the system. For example, after an error is found, a user can read the fail signature storage element to inquire about the type of error found in the system, and also the characteristics of the system that encountered the error. Using this information, a user may attempt to reproduce the error by executing subsequent operations (such as a read or write) with similar characteristics of the system that encountered the error. For example, a user may execute an operation using the same temperature value, voltage value, row address and/or column address, etc. as used with the original operation in which the error was encountered.

Allowing the user to reproduce an error may also provide the ability to verify a change made to the system that was made in attempt to resolve the error. For example, after the change to the system has been made (for example, replacing a DRAM), a user may execute operations with similar characteristics in which the original error was found. If the error no longer occurs, it may be determined that the change to the system has fixed the error.

While the foregoing is directed to embodiments of the present invention, other and further embodiments of the invention may be devised without departing from the basic scope thereof, and the scope thereof is determined by the claims that follow.

What is claimed is:

1. A multi-chip package (MCP), comprising:
   a first chip, comprising error detection logic and a first fail signature storage element; wherein the first chip is a volatile memory chip;
   a second chip, comprising a second fail signature storage element; wherein the second chip is a non-volatile memory chip; and
   a controller chip configured to copy the fail signature data from the first chip to the second chip; wherein the first and second fail signature storage elements are configured for storing fail signature data related to memory errors detected in the MCP; and wherein the chips are encapsulated in packaging thereby forming the multi-chip package.

2. The MCP of claim 1, wherein the fail signature storage element stores only a first error found in the system during a power on cycle.

3. The MCP of claim 1, wherein a fail signature storage element is also located on the controller.

4. The MCP of claim 1, wherein the error detection logic comprises Error Correction Code (ECC) logic.

5. The MCP of claim 1, wherein the error detection logic comprises Built-In Self Test (BIST) logic.

6. The MCP of claim 1, wherein:
the controller is configured to poll the fail signature storage element for fail signature data related to memory errors stored therein and, upon detecting fail signature data stored therein, store the fail signature data in the non-volatile memory chip.

7. The MCP of claim 1, wherein the fail signature data comprises:
an indication of a type of command detected.

8. The MCP of claim 1, wherein the fail signature data comprises:
at least one value of an operating parameter of the MCP at a time the corresponding memory error was detected.

9. The MCP of claim 8, wherein:
the at least one value comprises at least one of an operating voltage and a temperature.

10. The MCP of claim 1, wherein:
the first fail signature storage element is located in a configuration space of the volatile memory chip and/or the second signature storage element is located in a configuration space of the non-volatile memory chip.

11. A method for processing memory-related errors on a multi-chip package (MCP), comprising:
executing a write or read command from a controller located in the MCP to access data in a volatile memory chip;
detecting an error associated with execution of the write or read command;
storing fail signature data associated with the error in a fail signature storage element located in the volatile memory chip;
obtaining, by the controller, the fail signature data from the fail signature storage element; and
storing the fail signature data in a non-volatile memory chip of the MCP.

12. The method of claim 11, wherein detecting the error associated with execution of the write or read command is performed by Error Correction Code (ECC) logic.

13. The method of claim 11, wherein detecting the error associated with execution of the write or read command is performed by Built-In Self Test (BIST) logic.

14. The method of claim 11, wherein the fail signature data comprises:
an indication of a type of command detected.

15. The method of claim 11, wherein the obtaining, by the controller, the fail signature data from the fail signature storage element is done by executing a configuration read command to the fail signature storage element.

16. A system, comprising:
a printed-circuit board (PCB); and
a multi-chip package, comprising:
a first chip, comprising error detection logic and a first fail signature storage element; wherein the first chip is a volatile memory chip;
a second chip, comprising a second fail signature storage element;
wherein the second chip is a non-volatile memory chip; and
a controller chip configured to copy the fail signature data from the first chip to the second chip; wherein the first and second fail signature storage elements are configured for storing fail signature data related to memory errors detected in a multi-chip package; and wherein the chips are encapsulated in packaging thereby forming the multi-chip package;
wherein the multi-chip package is disposed on the PCB.

17. The system of claim 16, wherein a fail signature storage element is also located on the controller.

18. The system of claim 16, wherein the error detection logic comprises Error Correction Code (ECC) logic.

19. The system of claim 16, wherein the error detection logic comprises Built-In Self Test (BIST) logic.

20. The system of claim 16, wherein:
the first fail signature storage element is located in a configuration space of the volatile memory chip and/or the second fail signature storage element is located in a configuration space of the non-volatile memory chip.

* * * * *